United States Patent
Chiang et al.

(10) Patent No.: US 8,445,829 B2
(45) Date of Patent: May 21, 2013

(54) ACTIVE PHOTOSENSING PIXEL

(75) Inventors: Wen-Jen Chiang, Zhubei (TW);
Guo-Ren Hu, Banqiao (TW);
Chen-Pang Kung, Jhongli (TW)

(73) Assignee: Industrial Technology Research Institute, Hsinchu (TW)

( * ) Notice: Subject to any disclaimer, the term of this patent is extended or adjusted under 35 U.S.C. 154(b) by 342 days.

(21) Appl. No.: 12/954,885

(22) Filed: Nov. 28, 2010

(65) Prior Publication Data

US 2011/0303821 A1  Dec. 15, 2011

(30) Foreign Application Priority Data

Jun. 15, 2010  (TW) .............................. 99119406 A

(51) Int. Cl.
*H01L 27/146* (2006.01)
*H01J 40/14* (2006.01)

(52) U.S. Cl.
USPC ........................................ 250/208.1; 345/76

(58) Field of Classification Search
USPC ............ 250/208.1, 214.1, 214 R; 345/76–77, 345/82–83, 98–100; 315/169.3
See application file for complete search history.

(56) References Cited

U.S. PATENT DOCUMENTS

| 6,809,718 | B2 | 10/2004 | Wei |
| 6,927,433 | B2 | 8/2005 | Hynecek |
| 7,423,639 | B2 | 9/2008 | Min |
| 7,525,078 | B2 | 4/2009 | Fann |
| 2006/0119552 | A1 * | 6/2006 | Yumoto ........................... 345/76 |
| 2006/0119718 | A1 | 6/2006 | Hur |
| 2006/0267049 | A1 * | 11/2006 | Tang et al. ..................... 257/225 |
| 2007/0046587 | A1 * | 3/2007 | Takahara ........................ 345/76 |
| 2007/0080956 | A1 | 4/2007 | Fann |
| 2008/0007546 | A1 * | 1/2008 | Kawabe ......................... 345/211 |
| 2008/0087796 | A1 | 4/2008 | Fann |
| 2008/0143648 | A1 * | 6/2008 | Ishizuka et al. ................. 345/76 |
| 2008/0170011 | A1 * | 7/2008 | Kohno et al. ................... 345/77 |
| 2008/0252618 | A1 | 10/2008 | Chung |
| 2009/0101900 | A1 | 4/2009 | Chuang |
| 2009/0179243 | A1 | 7/2009 | Fann |

FOREIGN PATENT DOCUMENTS

| CN | 101515594 A | 8/2009 |
| CN | 101770316 A | 7/2010 |
| TW | I288900 | 10/2007 |

OTHER PUBLICATIONS

Eiji Kanda et al.; "Integrated Active Matrix Capacitive Sensors for Touch Panel LTPS-TFT LCDs"; Sid 08 Digest; 2008; pp. 834-837; ISSN-008-0966X/08/3902-0834.
Office Action of corresponding CN application, issued Sep. 28, 2012.

* cited by examiner

*Primary Examiner* — Seung C Sohn
(74) *Attorney, Agent, or Firm* — Wang Law Firm, Inc.; Li K. Wang; Stephen Hsu

(57) ABSTRACT

An active photosensing pixel is disclosed, in which a two-terminal photosensing transistor has a first terminal coupled to a first node, a second terminal coupled to a selection line and a control terminal connected to the second terminal. A driving transistor has a first terminal coupled to a first reference voltage, a second terminal coupled to an output line and a control terminal connected to the first node. A reset capacitor has a first terminal connected to the control terminal of the two-terminal photosensing transistor, and a second terminal connected to the first node.

15 Claims, 7 Drawing Sheets

ACTIVE PHOTOSENSING PIXEL

CROSS REFERENCE TO RELATED APPLICATIONS

This application claims priority of Taiwan Patent Application No. 099119406, filed on Jun. 15, 2010, the entirety of which is incorporated by reference herein.

BACKGROUND

1. Field of the Disclosure

The present disclosure relates to a display, and in particular relates to a photosensing pixel display.

2. Description of the Related Art

Lately, E-books have been developed and commercialized. One feasible display configuration for E-books, adopts a thin film transistor liquid crystal display (TFT-LCD) thereto. In other words, the E-book displays images by using electronic components, such as a TFT or photosensing device, disposed on a backplane thereof. E-books must have the ability to sense a photo so that marking on a screen by touching the screen may be accomplished. As an example, however, for an E-book with a photosensing function, since the photosensing device is installed under the backplane, light transmittance therethrough is decreased. Thus, E-Books needs amount of time for exposure of marking on a screen thereof.

An active photosensing pixel which can quickly mark on screen of E-books is desired.

BRIEF SUMMARY

A detailed description is given in the following embodiments with reference to the accompanying drawings.

An embodiment discloses an active photosensing pixel, comprising a two-terminal photosensing transistor, a driving transistor and a reset capacitor. The two-terminal photosensing transistor has a first terminal coupled to a first node, a second terminal coupled to a selection line and a control terminal connected to the second terminal. The driving transistor has a first terminal coupled to a first reference voltage, a second terminal coupled to an output line and the control terminal connected to the first node. The reset capacitor has a first terminal connected to the control terminal of the two-terminal photosensing transistor, and a second terminal connected to the first node.

An embodiment discloses another active photosensing array, comprising a plurality of selection lines, output lines and active photosensing pixels. Each active photosensing pixel comprises a two-terminal photosensing transistor, a driving transistor and a reset capacitor. The two-terminal photosensing transistor has a first terminal coupled to a first node, a second terminal coupled to a corresponding selection line and a control terminal connected to the second terminal. The driving transistor has a first terminal coupled to a first reference voltage, a second terminal coupled to a corresponding output line and the control terminal connected to the first node. The reset capacitor has a first terminal connected to the control terminal of the two-terminal photosensing transistor, and a second terminal connected to the first node.

An embodiment further discloses a photosensing method for an active photosensing pixel, wherein the active photosensing pixel comprises a two-terminal photosensing transistor having a first terminal coupled to a first node, a second terminal coupled to a selection line and a control terminal connected to the second terminal, a driving transistor having a first terminal coupled to a first reference voltage, a second terminal coupled to an output line and a control terminal connected to the first node and the reset capacitor, having a first terminal connected to the control terminal of the two-terminal photosensing transistor, and a second terminal connected to the first node. The photosensing method includes the following steps. First, a first voltage is provided to the selection line, during an exposure and readout cycle, such that the two-terminal photosensing transistor is served as a diode. Next, a diode current is generated to charge the first node when the two-terminal transistor receives an incident light, such that the driving transistor is turned on according to a voltage level of the first node to produce an output current to the selection line.

BRIEF DESCRIPTION OF THE DRAWINGS

The disclosure can be more fully understood by reading the subsequent detailed description and examples with references made to the accompanying drawings, wherein.

DETAILED DESCRIPTION

The embodiment will be explained as follows. The following description is made for the purpose of illustrating the embodiment and should not be taken in a limiting sense. The scope of the invention is best determined by reference to the appended claims.

Figure 1B:
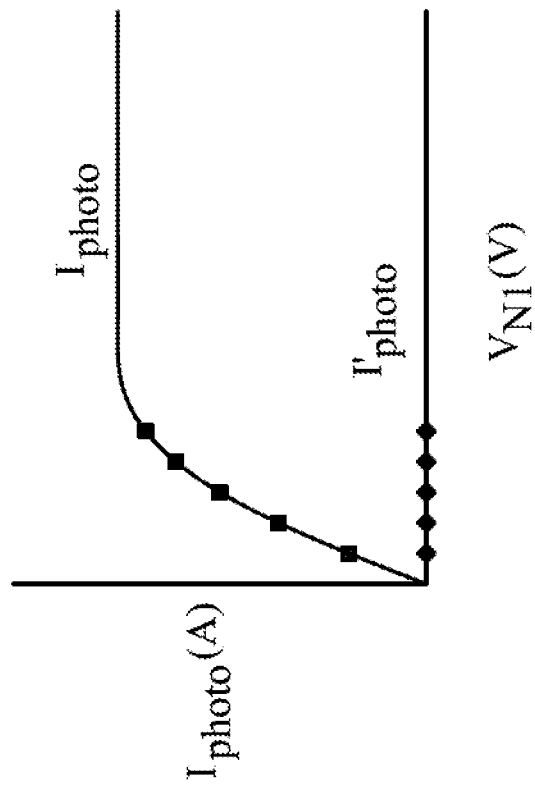
FIG. 1B is an embodiment of the relationship of the photosensing current $I_{photo}$ and the voltage $V_{N1}$ at the first terminal of the two-terminal photosensing transistor in the first operation mode.
Figure 1A:
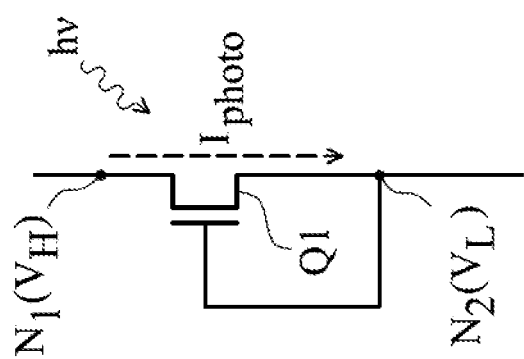
FIG. 1A is a schematic view showing an embodiment of the first operation mode for the two-terminal photosensing transistor.

FIG. 1A is a schematic view showing an embodiment of the two-terminal sensing transistor in a first operation mode. In this embodiment, the two-terminal photosensing transistor (written as $Q_1$ hereinafter) is an N-type a-Si:H TFT, but is not limited thereto. The two-terminal photosensing transistor $Q_1$ includes the first terminal $N_1$, the second terminal $N_2$ and a control terminal. Note that the control terminal of the two-terminal photosensing transistor $Q_1$ is connected to the second terminal $N_2$, wherein, it forms two terminals of the two-terminal photosensing transistor. That is, the first terminal $N_1$ and the control terminal are connected to the second terminal $N_2$. In the first operation mode, the high voltage $V_H$ is applied to the first terminal of the two-terminal photosensing transistor $Q_1$ and the low voltage $V_L$ is applied to the second terminal $N_2$. The two-terminal photosensing transistor $Q_1$ produces the photosensing current $I_{photo}$ from the first terminal $N_1$ to the second terminal $N_2$ when the two-terminal photosensing transistor $Q_1$ receives the incident light hv in the first operation mode. Generally speaking, the intensity of the photosensing current $I_{photo}$ is determined by the surface dimensions of the semiconductor layer and material of the two-terminal photosensing transistor $Q_1$. Moreover, the intensity of the photosensing current $I_{photo}$ can also be determined by the intensity of the incident light hv. In other words, the stronger the incident light hv is, the greater the photosensing current $I_{photo}$ will be. Therefore, the two-terminal photosensing transistor $Q_1$ is served as a photosensitive resistor in the first operation mode. For other embodiments, the two-terminal photosensing transistor $Q_1$ can be a P-type a-Si:H TFT, but is not limited thereto. In other embodiments, the two-terminal photosensing transistor $Q_1$ may be bipolar junction transistor (BJT) or other switching devices.

FIG. 1B is, during the first operation mode, the relationship of the photosensing current $I_{photo}$ and the voltage $V_{N1}$ at the first terminal of the two-terminal photosensing transistor $Q_1$. As shown in FIG. 1B, the magnitude of the photosensing current $I'_{photo}$ is zero (also named cut-off region) when there is no incident light hv (the line connected by diamond points as shown). On the contrary, when the two-terminal photosensing transistor $Q_1$ receives incident light hv (indicated as the line that connected by the square points), the photosensing current $I_{photo}$, which is produced by the two-terminal photosensing transistor $Q_1$, will linearly increase, before slowing down by degrees (known as the triode region), and finally, becoming saturated (known as the saturation region). Hence, the above description of the two-terminal photosensing transistor $Q_1$ is similar to the general field-effect transistor (FET). In one embodiment, the photosensing current $I_{photo}$ is around 7.5E−09A if the two-terminal photosensing transistor $Q_1$ receives the incident light and the level of the first terminal $N_1$ is 16V, and the photosensing current $I'_{photo}$ is around 0A if the two-terminal photosensing transistor $Q_1$ receives no incident light and the level of the first terminal $N_1$ is 16V. It can be determined whether the two-terminal photosensing transistor $Q_1$ has received the incident light by detecting the photosensing current $I_{photo}$ during the first operation mode.

Figure 2B:
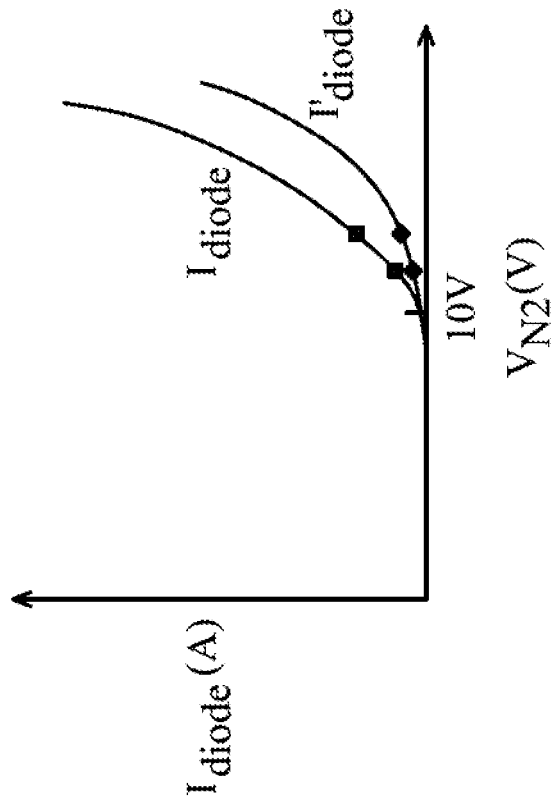
FIG. 2B is an embodiment of the relationship of the diode current $I_{diode}$ and the voltage $V_{N2}$ at the second terminal of the two-terminal photosensing transistor in the second operation mode.
Figure 2A:
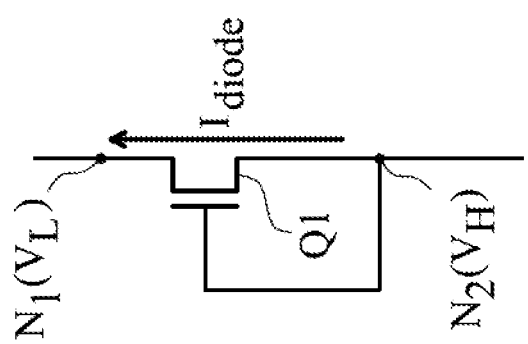
FIG. 2A is a schematic view showing an embodiment of the second operation mode for the two-terminal photosensing transistor.

FIG. 2A is a schematic view showing an embodiment of the two-terminal photosensing transistor $Q_1$ under the second operation mode. Similar with FIG. 1A, the control terminal of the two-terminal photosensing transistor $Q_1$ is also connected to the second terminal $N_2$. Compared with the first operation mode, a low voltage $V_L$ is applied to the first terminal $N_1$ of the two-terminal photosensing transistor $Q_1$ and a high voltage $V_H$ is applied to the second terminal $N_2$ for the second operation mode. Because both the control terminal of the two-terminal photosensing transistor $Q_1$ and the second terminal $N_2$ are coupled to the high voltage $V_H$ (MOS diode), the two-terminal photosensing transistor $Q_1$ is served as a diode in the second operation mode and produces the diode current $I_{diode}$ (i.e. forward conducting current) through the second terminal $N_2$ to the first terminal $N_1$.

FIG. 2B shows the relationship between the diode current $I_{diode}$ and the voltage $V_{N2}$ under the second terminal of the two-terminal photosensing transistor in the second operation mode. Similar with the general diode, the diode current $I_{diode}$ of the two-terminal photosensing transistor $Q_1$ is zero at the beginning, and then exponentially increases after the two-terminal photosensing transistor $Q_1$ is turned on. After the two-terminal photosensing transistor $Q_1$ is conducted ($V_{N2}>10V$), whether the two-terminal photosensing transistor $Q_1$ receives or doesn't receive the incident light hv, will not change the existence of the diode current $I_{diode}$, flowing through the second terminal $N_2$ to the first terminal $N_1$. It should be noted that the photosensing current $I_{photo}$ with incident light hv (the square point as shown) is bigger than that of the current $I'_{photo}$ without incident light hv (the diamond point as shown). In one embodiment, the diode current $I_{diode}$ is around 1.0E−09A if the two-terminal photosensing transistor $Q_1$ receives the incident light and the second terminal $V_{N2}$ is 15V. Conversely, if the two-terminal photosensing transistor $Q_1$ has not received incident light and the second terminal $V_{N2}$ is at 15V, the diode current $I'_{diode}$ will be around 0.5E−09A. Therefore, the second operation mode has two functions: the first is to determine whether the two-terminal photosensing transistor $Q_1$ has received the incident light by detecting/determining the magnitude of the diode current; and the second, is to discharge the second terminal $N_2$ by the diode current. Generally speaking, because the magnitude of the diode current $I_{diode}$ is much bigger than that of the photosensing current $I_{photo}$ (around 1.0E+03~1.0E+04 units), the process of discharging the second terminal $N_2$ by the diode current in the second operation mode is comparatively faster than that of charging the first terminal $N_1$ from the photosensing current in the first operation mode.

Figure 3:
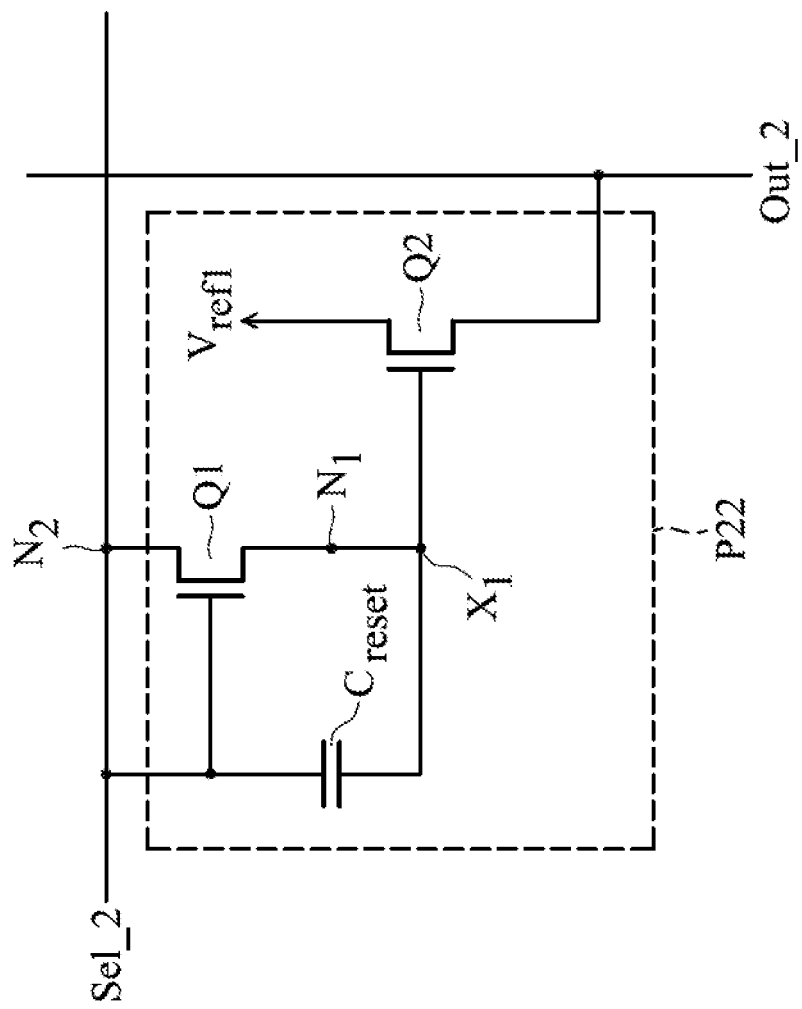
FIG. 3 is a schematic view showing an embodiment of the active photosensing pixel.

FIG. 3 is a schematic view showing the active photosensing pixel in one embodiment. In this embodiment, the active photosensing pixel $P_{22}$ comprises a two-terminal photosensing transistor $Q_1$, a driving transistor $Q_2$ and a reset capacitor $C_{reset}$. The active photosensing pixel $P_{22}$ is coupled between the selection line Sel_2 and the output line Out_2 perpendicular to the selection line Sel_2.

In the FIG. 3, the two-terminal photosensing transistor $Q_1$ has a first terminal $N_1$ coupled to the first node $X_1$, a second terminal $N_2$ coupled to the selection line Sel_2 and a control terminal connected to the second terminal $N_2$. The driving transistor $Q_2$ has a first terminal coupled to the first reference voltage $V_{refl}$, a second terminal coupled to the output line Out_2 and the control terminal connected to the first node $X_1$. The capacitor $C_{reset}$ has a first terminal, connected to the control terminal of the two-terminal photosensing transistor $Q_1$ and a second terminal connected to the first node $X_1$.

Figure 4:
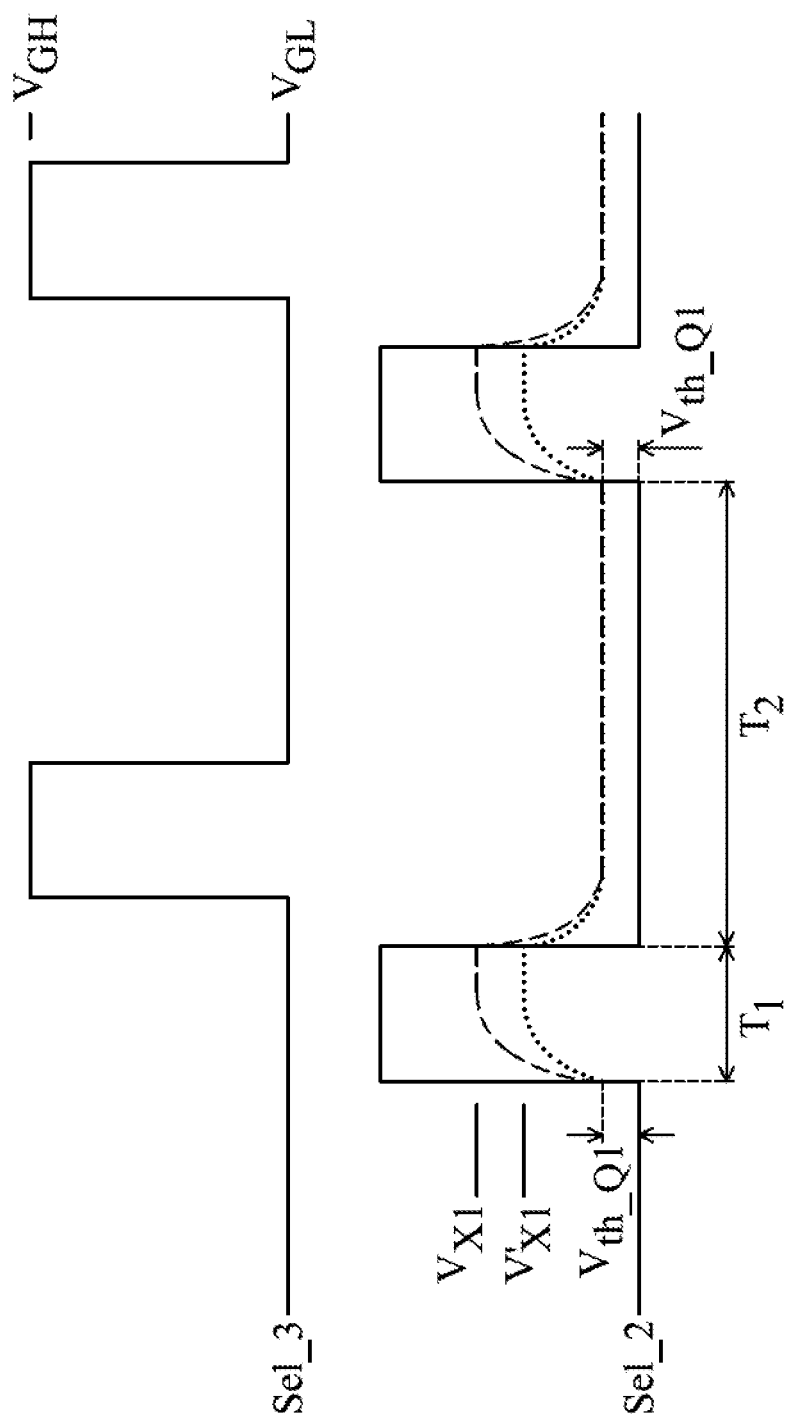
FIG. 4 is a sequence diagram showing an embodiment of the selection lines and the voltage waveform of the first node.

Following, is a description of the photosensing measure. As the sequence diagram of the selection lines and the waveform of the first node $X_1$ shows in FIG. 4, the waveform of the first node $X_1$ comprises two situations for the active photosensing pixel $P_{22}$: one is receiving the incident light hv; and the other is not receiving the incident light hv. In FIG. 4, the solid lines represent the sequence diagram of the selection line Sel_2 and Sel_3, respectively. The break line represents the voltage waveform of the first node $V_{X1}$ when the active photosensing pixel $P_{22}$ has received the incident light hv, and the dotted line shows the voltage waveform of the first node $V'_{X1}$ when the active photosensing pixel $P_{22}$ has not received incident light.

The following is a discussion about the operation mode of the two-terminal photosensing transistor. During the first cycle $T_1$ (known as the exposure and readout cycle) the selection line Sel_2 is pulled up to a high voltage (such as a high driving voltage $V_{GH}$) which is higher than that of the first node $X_1$, and the two-terminal photosensing transistor $Q_1$ is served as a diode and produces the diode current $I_{diode}$ according to the incident light hv and further charges the first node $X_1$. For example, when the active photosensing pixel $P_{22}$ receives the incident light hv, the two-terminal photosensing transistor $Q_1$ will produce a diode current $I_{diode}$ according to the incident light hv, and further charge the first node $X_1$ to a high voltage $V_{X1}$. When the voltage $V_{X1}$ is higher than that of the threshold level of the driving transistor $Q_2$, the latter will be conducted by the voltage $V_{X1}$ and produce an output current to the output line. Out_2: hence, the first cycle $T_1$ is also a readout cycle. On the other hand, during the first cycle $T_1$, if the level of selection line Sel_2 is pulled up to be higher than that of the first node $X_1$ (such as a high driving voltage $V_{GH}$) and no incident light irradiates on the active photosensing pixel $P_{22}$, the first node $X_1$ will be charged to the high voltage $V'_{X1}$ through the diode current $I'_{diode}$ of the two-terminal photosensing transistor $Q_1$. From the description above, it is clear that the second operation mode of the two-terminal photosensing transistor $Q_1$ has been employed. Note that when the incident light irradiates on the two-terminal photosensing transistor $Q_1$, the intensity of the diode current $I_{diode}$ is greater than that of the diode current $I'_{diode}$ which has no incident light irradiating thereon, and then the two-terminal photosensing transistor $Q_1$ here is served as a diode. Therefore, designing the threshold level of the driving transistor $Q_2$ between the $V_{X1}$ and $V'_{X1}$, that corresponds to the diode current $I_{diode}$ of the incident light and the diode current $I'_{diode}$ having no incident light, respectively, enables the driving transistor $Q_2$ to be able to be conducted by the diode current $I_{diode}$ (having incident light) other than by the diode current $I'_{diode}$ (not having incident light), so that whether the incident light hv irradiates on the active photosensing pixel $P_{22}$ may be determined. Namely, the driving transistor $Q_2$ can be turned on when the voltage on the first node $X_1$ is $V_{X1}$, and can not be turned on when the voltage on the first node $X_1$ is $V'_{X1}$.

During the second cycle $T_2$ (normally named reset cycle) the level of selection line Sel_2 is pulled to be lower than that of that of the level of $X_1$ (such as the low driving voltage, $V_{GL}$), such that the reset capacitor $C_{reset}$ will reset the first node voltage $V_{X1}$, due to the capacitive coupling effect, to turn off the driving transistor $Q_2$.

For the second cycle $T_2$, since the driving transistor $Q_2$ is not conducted, the two-terminal photosensing transistor $Q_1$ does not produce the diode current, even though the incident light hv is irradiated thereupon. Note that the resetting of the voltage $V_{X1}$ at the first node $X_1$ is completed by means of resetting the reset capacitor $C_{reset}$ in this embodiment. In this embodiment, the high driving voltage $V_{GH}$ of the selection line is 10V, and the low driving voltage $V_{GL}$ of the selection line is 0V. Subsequently, the high voltage $V_{X1}$ and low voltage $V'_{X1}$ of the first node $X_1$ is between $V_{GH}$ and $V'_{GH}$, wherein the $V_{X1}$ is higher than $V'_{X1}$. The voltage waveform at the first node $X_1$ is at least $V_{th\_Q1}$ higher than that of the low driving voltage $V_{GL}$, wherein, the $V_{th\_Q1}$ is the threshold level of the two-terminal photosensing transistor $Q_1$.

Figure 5:
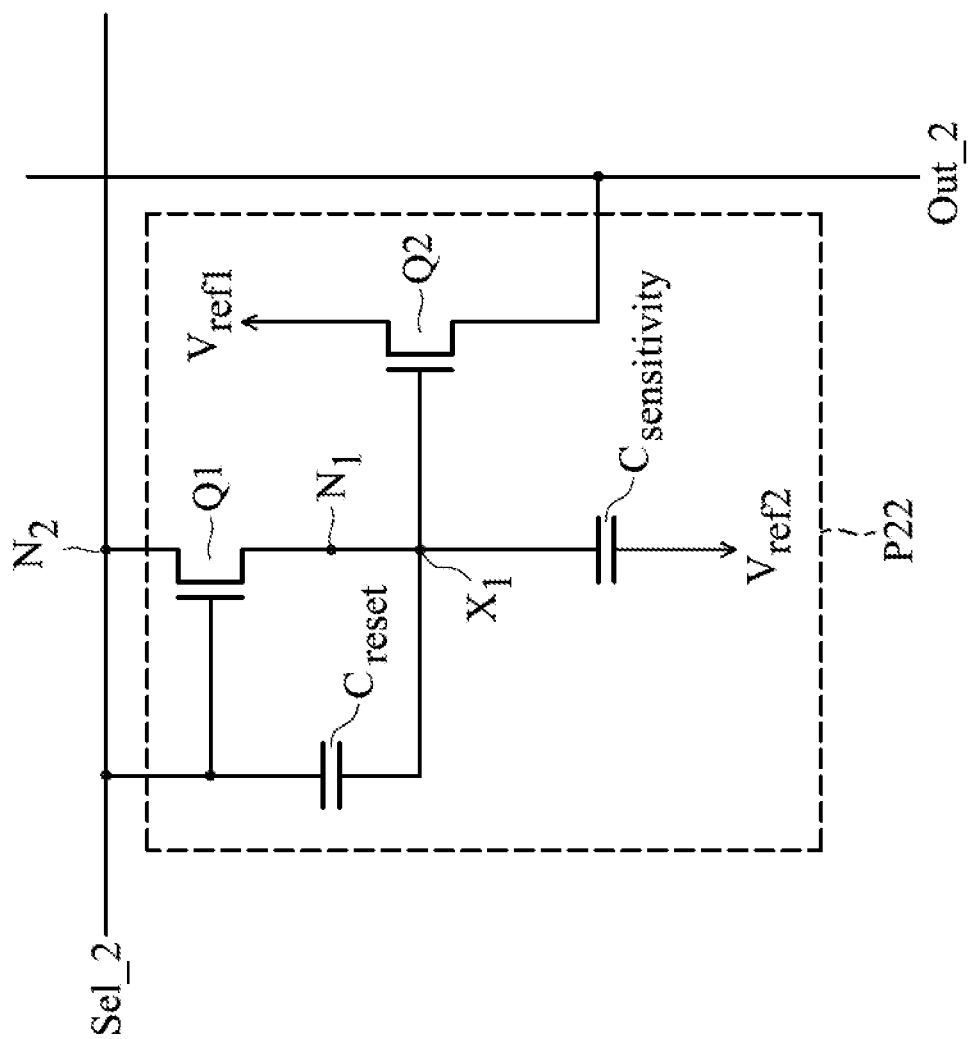
FIG. 5 is a schematic view showing another embodiment of the active photosensing pixel.

FIG. 5 is a schematic view of the active photosensing pixel. This embodiment is similar with FIG. 3. As such, for simplification, the circuit and sequence of selection lines will not be described in detail here. It should be noted that the active photosensing pixel $P_{22}$ may further comprise a sensitivity control capacitor $C_{sensitivity}$, wherein the sensitivity control capacitor $C_{sensitivity}$ has a first terminal connecting to the first node $X_1$ and a second terminal connecting to the second reference voltage $V_{ref2}$.

Following is the description for the function of the sensitivity control capacitor $C_{sensitivity}$. According to the descriptions above, by adjusting the voltage (i.e. $V_{X1}$ corresponding to the first node $X_1$) of the driving transistor $Q_2$, it can be determined whether the active photosensing pixel $P_{22}$ has received the incident light. Following is the relationship between the voltage differential $\Delta V_{X1}$ of first node $X_1$ and the voltage differential $\Delta V_{Sel\_2}$ of selection line Sel_2, in this embodiment:

$$\Delta V_{X1} = \frac{C_{sensitivity}}{C_{reset} + C_{sensitivity}} \Delta V_{Sel\_2}$$

wherein when the diode current $I_{diode}$ is high (meaning $\Delta V_{X1}$ is greatly differed), a sensitivity control capacitor $C_{sensitivity}$ with larger capacitance is employed, and when a diode current $I_{diode}$ is low (meaning $\Delta V_{X1}$ is differed slightly), the sensitivity control capacitor $C_{sensitivity}$ with smaller capacitance is employed. Specifically, when the voltage differential $\Delta V_{Sel\_2}$ is a constant and a high sensitivity of the driving transistor $Q_2$ is required (meaning $\Delta V_{X1}$ has not greatly differed), the sensitivity control capacitor $C_{sensitivity}$ with smaller capacitance will be employed. Therefore, even if the incident light hv is weak, resulting in a low diode current $I_{diode}$, the driving transistor $Q_2$ can still sense the weak incident light hv by employing a sensitivity control capacitor $C_{sensitivity}$ with small capacitance. Thus, compared with the convention method, this embodiment has a better signal-to-noise ratio (SNR).

Figure 6:
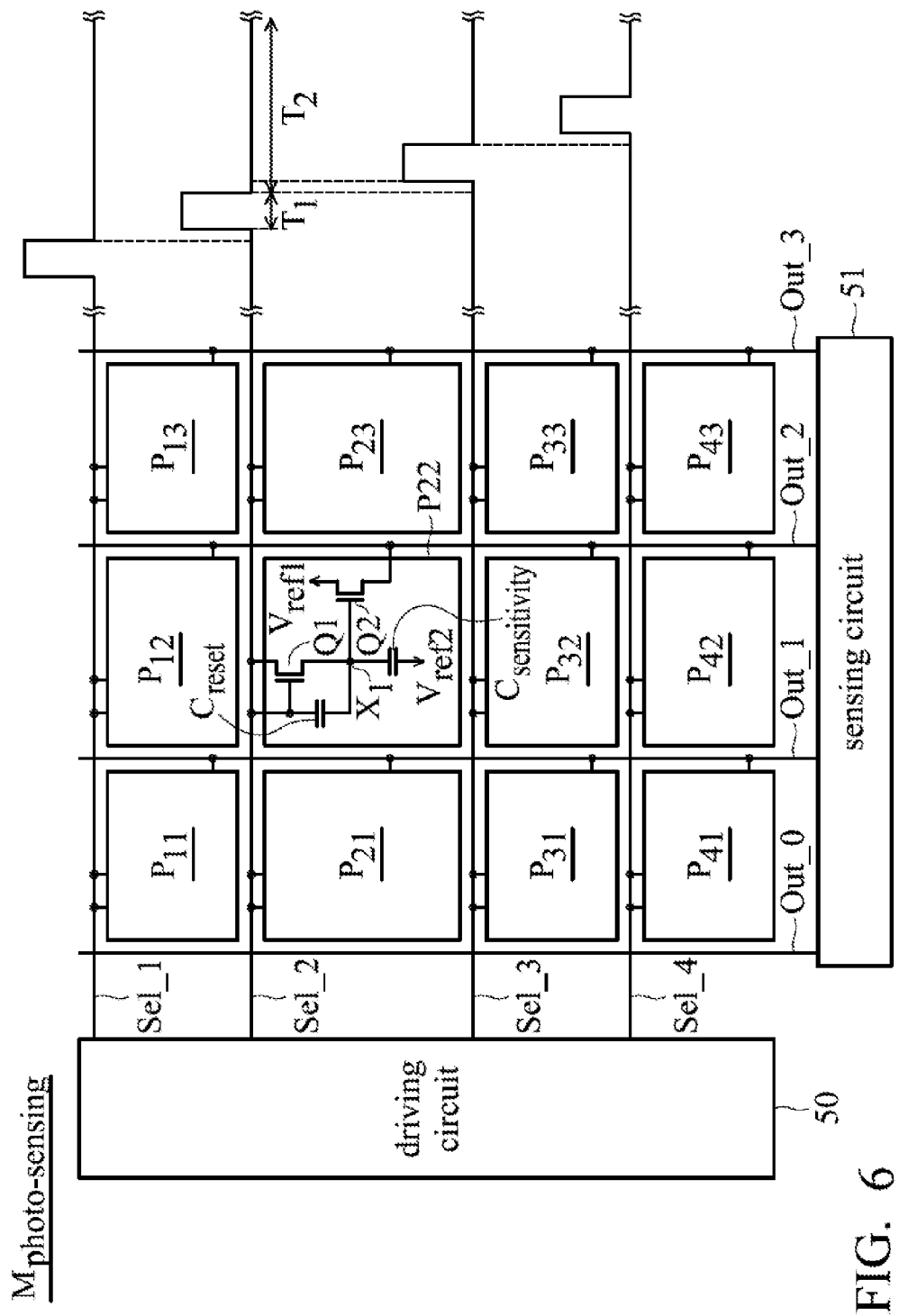
FIG. 6 is a schematic view showing an embodiment of the active photosensing array and a sequence diagram of the corresponding selection lines.

FIG. 6 is a schematic view showing the active photosensing array and a sequence diagram of the corresponding selection lines. The active photosensing array $M_{photosensing}$ comprises a plurality of selection lines Sel_1-Sel_4, a plurality of output lines Out_0-Out_3, a plurality of active photosensing pixels $P_{11}$-$P_{43}$, a driving circuit 50 and a sensing circuit 51. In this embodiment, each active photosensing pixel $P_{11}$-$P_{43}$ is similar with those of the embodiment in FIG. 5, in general. For simplification, the description of the circuit connection and the sequence diagram of the selection lines Sel_1-Sel_4 will not be described in detail. The driving circuit 50 may enable the selection signal to the selection lines Sel_1-Sel-4 in sequence. For example, for the first cycle $T_1$ (exposure and readout cycle), the selection line Sel_2 is pulled up to be higher than that of the first node $X_1$ (i.e. high driving voltage $V_{GH}$). Subsequently, the two-terminal photosensing transistor $Q_1$ is served as a diode and produces the diode current $I_{diode}/I'_{diode}$ according to the intensity of the incident light hv, such that the first node $X_1$ is charged to the high voltage $V_{X1}/V'_{X1}$. When the voltage of the first node $X_1$ is higher than that of the threshold level of the driving transistor $Q_2$, the latter is conducted and produces an output current to the output line Out_2. Afterwards, the sensing circuit 51, by means of detecting or determining the output current, determines whether the active photosensing pixel $P_{22}$ has received the incident light hv. Thus, the first cycle $T_1$ is also the readout cycle. The threshold level of the driving transistor Q2 is designed to be between the voltages $V_{X1}$ and $V'_{X1}$ corresponding to the diode current $I_{diode}$ of the incident light and the diode current $I'_{diode}$ having no incident respectively. Hence, the driving transistor Q2 is turned on under the circumstance that the first node $X_1$ is $V_{X1}$, and is not turned on while the first node $X_1$ is $V'_{X1}$.

Furthermore, for the second cycle, the voltage level of the selection line Sel_2 is pulled down to be lower than that of the first node $X_1$ (such as the low driving voltage $V_{GL}$), and the driving transistor $Q_2$ resets the latter by resetting the reset capacitor $C_{reset}$ to turn off the driving transistor $Q_2$. Note that when the selection line Sel_2 is pulled high under the first cycle $T_1$, the selection lines Sel_1, Sel_3 and Sel_4 will be pulled low under the second cycle T2. In other words, the scan array corresponding to the selection lines Sel_1, Sel_3 and Sel_4 will be turned off, so that the neighboring selection lines Sel_1 and Sel_3 of the selection line Sel_2 will not interrupt the selection line Sel_2. In other embodiments, the active photosensing array $M_{photosensing}$ includes at least four selection lines, above three scan lines and more than twelve photosensing pixels. Persons skilled in the art may design the active photosensing array $M_{photosensing}$ in accordance with product needs.

Figure 7:
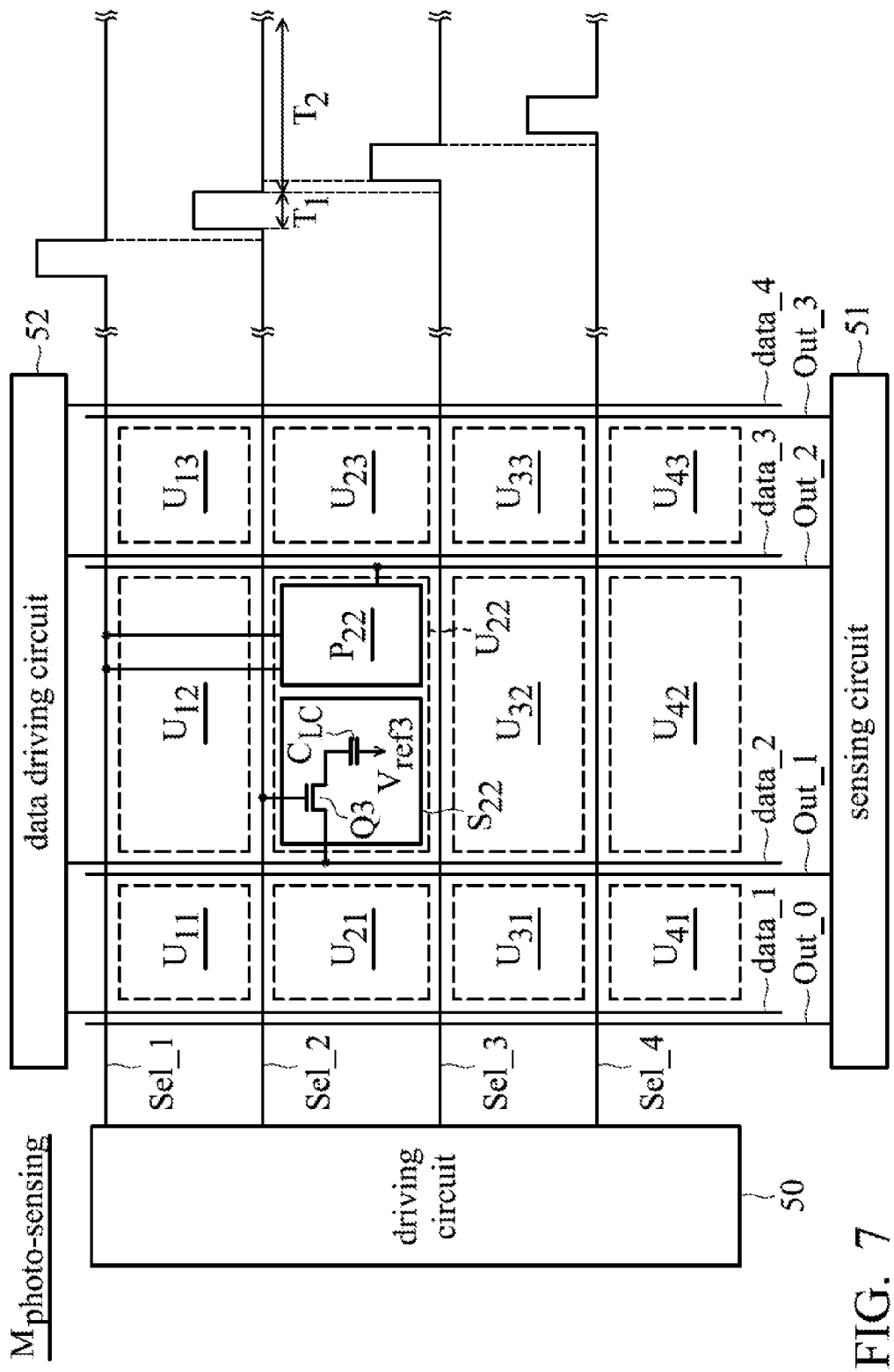
FIG. 7 is a schematic view showing an embodiment of the display with an active photosensing array and a sequence diagram of the corresponding selection lines.

FIG. 7 is a schematic view showing a display with an active photosensing array and a sequence diagram corresponding to the selection lines. The display with the active photosensing array $M_{sensing-display}$ comprises a plurality of selection lines Sel_1-Sel_4, a plurality of output lines Out_0-Out_3, a plurality of data lines data_1-data_4, a plurality of active photosensing and displaying units $U_{11}$-$U_{43}$, a driving circuit 50, a sensing circuit 51 and a data driving circuit 52. As shown in FIG. 7, each of the active photosensing and displaying units $U_{11}$-$U_{43}$ comprises an active photosensing pixel (as $P_{22}$) and a display pixel (as $S_{22}$), and thereamong, each of the active photosensing pixels can be installed in accordance with the above-said embodiments. Therefore, detailed descriptions of the active photosensing pixel and display pixel will be omitted here for brevity. With reference to the display pixel $S_{22}$, it comprises a switch transistor $Q_3$ and a liquid crystal capacitor $C_{LC}$, and thereamong, the switch transistor $Q_3$ comprises a first terminal coupled to the second data line data_2, a second terminal, and a control terminal coupled to the selection line Sel_2. Meanwhile, the liquid crystal capacitor $C_{LC}$ comprises a first terminal coupled to the second terminal of the switch transistor Q3 and a second terminal coupled to a third reference voltage $V_{ref3}$.

The following is the discussion for the operation of the display with the active photosensing array. For example, for the first cycle, the voltage level of the selection line Sel_1 is pulled up to be higher than that of the first node $X_1$ of the photosensing pixel $P_{22}$ (i.e. the high driving voltage $V_{GH}$). Subsequently, the two-terminal photosensing transistor $Q_1$ is served as a diode and produces the diode current $I_{diode}$ according to the extent of the incident light hv, so that the first node $X_1$ is charged to a high voltage $V_{X1}/V'_{X1}$. When the voltage of the first node $X_1$ is higher than that of the threshold level of the driving transistor $Q_2$ voltage, the driving transistor $Q_2$ is turned on and produces an output current to the output line Out_2, and then, the sensing circuit 51, by means of detecting or determining the output current, determines whether the active photosensing pixel $P_{22}$ receives the incident light hv. Therefore, the first cycle $T_1$ is also the readout cycle. The threshold level of the driving transistor Q2 voltage is designed to be between the voltages $V_{X1}$ and $V'_{X1}$ corresponding to the diode current $I_{diode}$ of the incident light and the diode current $I'_{diode}$ having no incident light, respectively. Hence, the driving transistor Q2 is turned on when the voltage level of the first node $X_1$ is $V_{X1}$ and turned off when the voltage level of the first node $X_1$ is $V'_{X1}$.

Subsequently, during the second cycle $T_2$, the voltage of the selection line Sel_1 is pulled down to be lower than that of the first node $X_1$ (such as the low driving voltage $V_{GL}$), and the reset capacitor $C_{reset}$ will reset the first node voltage $V_{X1}$, due to the capacitive coupling effect, to turn off the driving transistor $Q_2$. In addition, the driving circuit 50 enables the selection line Sel_2, so that the switch transistor Q3 of the display pixel $S_{22}$ is turned on. Therefore, the display pixel $S_{22}$ displays images according to the data received from the second data line data_2.

The embodiments provide an active photosensing pixel and photosensing method. Compared with the conventional passive photosensing pixel, the photosensing pixels in the embodiments have higher signal-to-noise ratio and driving ability, which can meet the needs of large display dimensions. Moreover, the control terminal of the two-terminal photosensing transistor $Q_1$ is connected to the second terminal; therefore, variations in threshold level voltages of the two-terminal photosensing transistor $Q_1$ will not influence the display device. In the embodiments, the photosensing pixels and array can be disposed at the backplane of the display device and replace the conventional charge coupled device (CCD) photo sensor and the CMOS photo sensor.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An active photosensing pixel, comprising:
    a two-terminal photosensing transistor, having a first terminal coupled to a first node, a second terminal coupled to a selection line and a control terminal connected to the second terminal;
    a driving transistor, having a first terminal coupled to a first reference voltage, a second terminal coupled to an output line and a control terminal connected to the first node; and
    a reset capacitor, having a first terminal connected to the control terminal of the two-terminal photosensing transistor, and a second terminal connected to the first node.

2. The active photosensing pixel as claimed in claim 1, further comprising a sensitivity control capacitor, having a first terminal connected to the first node and a second terminal connected to a second reference voltage.

3. The active photosensing pixel as claimed in claim 1, wherein, during an exposure and readout cycle, a level of the selection line is pulled up to be higher than that of the first node, and the two-terminal photosensing transistor is served as a diode to produce a diode current according to an incident light, wherein the first node is charged by the diode current, such that the driving transistor generates an output current to the output line.

4. The active photosensing pixel as claimed in claim 3, wherein, during a reset cycle after the exposure and readout cycle is completed, the level of the selection line is pulled down to be lower than that of the first node, such that the reset capacitor resets the first node to turn off the driving transistor due to the capacitive coupling effect.

5. The active photosensing pixel as claimed in claim 1, wherein the two-photosensing transistor is an N-type a-Si:H TFT.

6. An active photosensing array, comprising:
    a plurality of selection lines;
    a plurality of output lines; and
    a plurality of active photosensing pixels, each including:
    a two-terminal photosensing transistor, having a first terminal coupled to a first node, a second terminal coupled to a corresponding selection line and a control terminal connected to the second terminal;
    a driving transistor, having a first terminal coupled to a first reference voltage, a second terminal coupled to a corresponding output line and a control terminal connected to the first node; and
    a reset capacitor, having a first terminal connected to the control terminal of the two-terminal photosensing transistor, and a second terminal connected to the first node.

7. The active photosensing array as claimed in claim 6, wherein the active photosensing pixels each comprise a sensitivity control capacitor having a first terminal connected to the first node and a second terminal connected to a second reference voltage.

8. The active photosensing, array as claimed in claim 6, wherein, during an exposure and readout cycle, a level of the corresponding selection line is pulled up to be higher than that of the level at the first node, and the two-terminal photosensing transistor is served as a diode to produce a diode current according to an incident light, wherein the first node is charged by the diode current, such that the driving transistor generates an output current to the corresponding output line.

9. The active photosensing array as claimed in claim 8, wherein during a reset cycle after the exposure and read out cycle is completed, the level of the corresponding selection line is pulled down to be lower than that of the first node, such that the reset capacitor resets the first node to turn off the driving transistor due to the capacitive coupling effect.

10. The active photosensing array as claimed in claim 6, wherein the two-terminal photosensing transistor is an N-type a-Si:H TFT.

11. A photosensing method for an active photosensing pixel, wherein the active photosensing pixel comprises a two-terminal photosensing transistor having a first terminal coupled to a first node, a second terminal coupled to a selection line and a control terminal connected to the second terminal, a driving transistor having a first terminal coupled to a first reference voltage, a second terminal coupled to an output line and a control terminal connected to the first node, and a reset capacitor, having a first terminal connected to the control terminal of the two-terminal photosensing transistor, and a second terminal connected to the first node, comprising:

providing a first voltage to the selection line, during an exposure and readout cycle, such that the two-terminal photosensing transistor is served as a diode, and generating a diode current to charge the first node when the two-terminal transistor receives an incident light, such that the driving transistor is turned on according to a voltage level of the first node to produce an output current to the selection line.

12. The photosensing method as claimed in claim 11, further comprising providing a second voltage to the selection line during a reset cycle after the exposure and readout cycle is completed, such that the reset capacitor resets the first node to turn off the driving transistor.

13. The photosensing method as claimed in claim 11, wherein the first voltage is higher than that of the level of the first node.

14. The photosensing method as claimed in claim 12, wherein the second voltage is lower than that of the first node.

15. The photosensing method as claimed in claim 11, wherein the two-terminal photosensing transistor is an N-type a-Si:H TFT.

\* \* \* \* \*